United States Patent
Naffziger

(10) Patent No.: US 6,943,586 B2
(45) Date of Patent: Sep. 13, 2005

(54) METHOD AND SYSTEM TO TEMPORARILY MODIFY AN OUTPUT WAVEFORM

(75) Inventor: Samuel D. Naffziger, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 21 days.

(21) Appl. No.: 10/646,935

(22) Filed: Aug. 22, 2003

(65) Prior Publication Data

US 2005/0040858 A1 Feb. 24, 2005

(51) Int. Cl.⁷ .............................................. H03K 19/003
(52) U.S. Cl. ............................. 326/79; 326/93; 326/96; 326/99
(58) Field of Search ............................. 326/93–99, 16, 326/29

(56) References Cited

U.S. PATENT DOCUMENTS

| | | | |
|---|---|---|---|
| 4,170,715 A | | 10/1979 | Mizokawa |
| 5,507,456 A | | 4/1996 | Brown et al. |
| 5,550,487 A | * | 8/1996 | Lyon ............................ 326/33 |
| 5,949,723 A | | 9/1999 | Clemen et al. |
| 6,075,386 A | | 6/2000 | Naffziger |
| 6,097,207 A | | 8/2000 | Bernstein et al. |
| 6,127,858 A | * | 10/2000 | Stinson et al. ................. 327/99 |
| 6,281,710 B1 | | 8/2001 | Poirier et al. |
| 6,339,835 B1 | | 1/2002 | Reddy et al. |
| 6,518,796 B1 | | 2/2003 | Stan et al. |
| 6,529,045 B2 | | 3/2003 | Ye et al. |
| 6,781,416 B1 | | 8/2004 | Nguyen et al. |

* cited by examiner

Primary Examiner—Anh Q. Tran

(57) ABSTRACT

Systems and methods are disclosed for controlling an associated circuit. A clock waveform that transitions between normally high and low levels over a cycle in a first operating mode is provided to the associated circuit. The clock waveform is modified to include an intermediate level between the normally high and low levels over a cycle in a second operating mode.

24 Claims, 7 Drawing Sheets

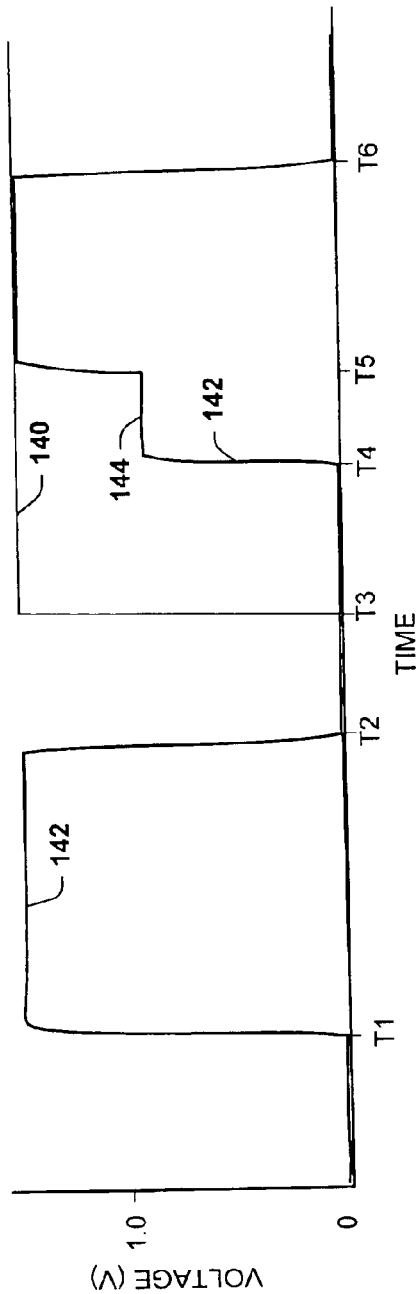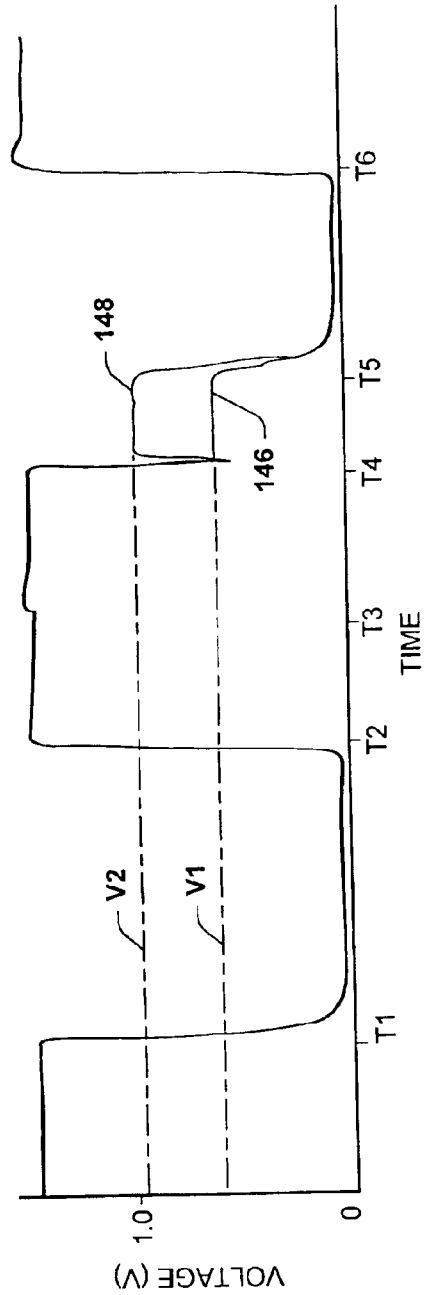

METHOD AND SYSTEM TO TEMPORARILY MODIFY AN OUTPUT WAVEFORM

RELATED APPLICATION

This application is related to co-pending and commonly assigned U.S. patent application Ser. No. 10/646,936 to Naffziger et al., which was filed Aug. 22, 2003, and entitled "SYSTEM TO TEMPORARILY MODIFY AN OUTPUT WAVEFORM," the disclosure of which is incorporated herein by reference.

TECHNICAL FIELD

The present invention relates to implementing control for electrical circuitry and, more particularly, to a method to temporarily modify an output waveform.

BACKGROUND OF INVENTION

In the manufacturing of various types of integrated circuits (ICs), a process referred to as burn-in is employed to reduce failures due to infant mortality. Burn-in accelerates defects by operating the circuitry under extreme operating conditions for a period of time. The time period and conditions (input power cycling, load switching, temperature, etc.) generally vary according to manufacturer and the type of IC.

For very large scale integration (VLSI) designs, operating conditions for burn-in generally include a much higher voltage and temperature than during normal operation for the device. The burn-in test process thus exposes a potential defect in the chip by operating the circuitry under such extreme conditions. For instance, a processor that normally operates at 1.5 V and at a maximum temperature of 110 degrees C., such as when used in a computer, might be burned in at 2.1V and 120 C. These elevated operating conditions accelerate failures due to latent, but not catastrophic manufacturing defects.

In order for burn-in to effectively accelerate the occurrence of these latent defects, however, the device must be operating correctly so that a very high percentage of the circuitry is activated. Accordingly, the burn-in operating conditions maintain substantially all parts of the chip active and then appropriate testcases are run on the chip to verify the functionality under the increased stress operating conditions associated with burn-in. During burn-in, the operating frequency is much slower than during normal operation. Thus, ensuring proper operation of the chip during burn-in can become difficult for certain types of circuitry, and further increases as greater device densities are implemented for ICs.

Domino gates are an example of one type of circuitry that tends to operate deficiently during burn-in conditions. For example, domino gates can fail in the absence of taking explicit steps to protect such circuitry during burn-in. Thus, to help these and other types of circuits operate correctly, supplemental circuitry, such as a keeper circuit, has been developed. A keeper circuits operates to prevent a node or bit from losing its charge, for example, by supplying a voltage at such node. Some types of keeper circuits can impose penalties since large areas may be needed to implement such circuitry, or the operation of the gate can be slowed. Additionally or alternatively, existing keeper circuits may require use of an external signal to implement keeper functions at appropriate times. The extra overhead associated with these and other keeper solutions can further result in decreased performance during normal operation.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some general concepts of the invention in a simplified form as a prelude to the more detailed description that is presented later.

The present invention relates generally to systems and methods for temporarily modifying an output waveform. According to one embodiment, the present invention relates to a method for controlling an associated circuit. The method includes providing a clock waveform to the associated circuit that transitions between normally high and low levels over a cycle in a first operating mode. The clock waveform provided to the associated circuit is modified to include an intermediate level between the normally high and low levels over a cycle in a second operating mode.

Another embodiment of the present invention relates a clock generator that includes a driver that provides an output waveform to drive at least one associated circuit based on at least one control signal. A control network provides the at least one control signal to cause the driver to provide the output waveform to transition between normally high and low levels during a first operating mode. The control network provides the at least one control signal to cause the driver to provide the output waveform to include a temporary intermediate level that is between the normally high and low levels during a second operating mode.

BRIEF DESCRIPTION OF THE DRAWINGS

FIG. 3 is a graph depicting sample waveforms that can be implemented in accordance with an embodiment of the present invention.

FIG. 4 is a graph depicting an example of control waveforms that can be employed to control an output waveform in accordance with an embodiment of the present invention.

DETAILED DESCRIPTION

The present invention relates generally to systems and method to temporarily modify an output waveform (e.g., a clock signal). In a first operating mode (e.g., a normal mode), the output waveform transitions between normally high and low levels. In a second operating mode (e.g., a noise reduction mode), the output waveform is temporarily modified to an intermediate level between the normally high and low levels. After providing the output waveform at the intermediate level for a desired duration in the second operating mode, the output waveform can transition between its corresponding normally high and low levels.

The second operating mode, for example, can correspond to a process associated with a high stress condition (e.g., burn-in). By providing the output waveform at the intermediate level, associated circuitry can be protected by mitigating noise that may occur in such circuitry during the high stress conditions. For example, the associated circuitry can include a precharge device coupled to receive the output waveform. The precharge device can operate as a supplemental keeper to mitigate noise at an associated node in response to receiving the output waveform at the intermediate level.

Figure 1:
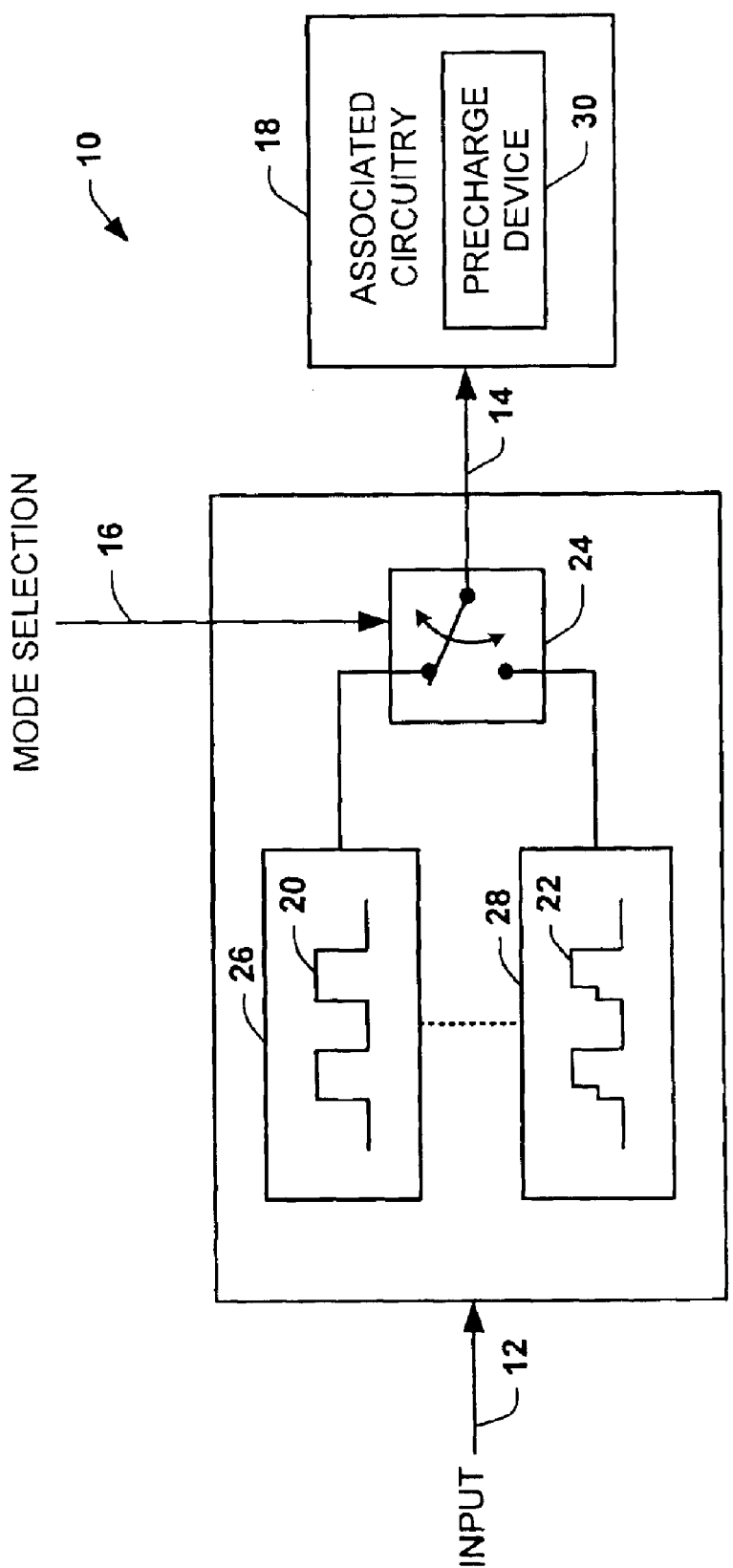
FIG. 1 depicts a block diagram of a signal generator that can be implemented in accordance with an embodiment of the present invention.

FIG. 1 depicts a block diagram of a system that can be utilized to temporarily modify an output waveform in accordance with an aspect of the present invention. The system 10 receives one or more input signals at 12 and provides a corresponding output signal at 14. The output signal at 14 transitions between normally high and low levels at a desired frequency. The frequency of the output signal at 14 can vary according to the operating mode of the system 10. The system 10 can provide the waveform with at least two different waveform characteristics based on an operating mode of the system. The operating mode can be controlled based at least in part on a mode selection signal provided at 16.

According to an aspect of the present invention, the system 10 can operate in two or more modes, including a normal operating mode and a noise reduction mode. As used herein, the noise reduction mode can be associated with conditions during which it may be desirable to protect associated circuitry 18. For example, noise reduction mode corresponds to high stress operating conditions, which can include a higher operating voltage and a higher operating temperature than normal, such as in a burn-in process. Additionally, in the noise reduction mode, the output signal provided at 14 typically has a much lower frequency (e.g., slower clock speed) than when operating in the normal operating mode.

The system 10 is operative to provide one of two or more possible waveforms 20 and 22 selectively at the output 14 to control the associated circuitry 18 accordingly. A mode selector, schematically indicated at 24, is operative to select which of the corresponding signals 20 and 22 is to be provided at 14 based at least in part on the mode selection signal at 16. According to an aspect of the present invention, the mode selector 24 provides the signal at 14 based on the mode selection signal at 16 and the one or more input signals provided at 12.

By way of example, the mode selection signal provided at 16 corresponds to a burn-in enable signal that is utilized to indicate that a burn-in process is being implemented on the system 10 and the associated circuitry 18. In accordance with an aspect of the present invention, during burn-in, the mode selector 24 is activated so that the signal 22 having the intermediate level is provided at the output 14 to the associated circuitry 18. This helps protect the circuitry 18 as well as facilitates accurate evaluation thereof under the high stress conditions associated with burn-in.

In the example depicted in FIG. 1, the waveform 20 is depicted as a normal clock signal that transitions between high and low levels, generally defining a square wave having a desired frequency. The frequency of the waveform 20 can be determined based on the one or more input signals provided at 12. The other waveform 22 corresponds to a signal includes a duration at an intermediate level, which can be implemented at a low-to-high transition or a high-to-low transition depending on the type of circuit being controlled by the output signal at 14. For example, the waveform 22 can begin at a low level and transition to an intermediate level between the normally high and low levels. The waveform 22 remains at the intermediate level for a duration of a first portion of a corresponding clock cycle, which duration can be fixed or variable. After the duration at the intermediate level, the signal can transition to the normally high level where it can remain for the remainder of the first portion of the clock cycle. Then, the signal returns to the normally low level where it remains for a second part of the clock cycle according to the duty cycle and frequency implemented during the noise reduction mode. The waveform 22 can repeat this pattern during the noise reduction mode.

In the example of FIG. 1, the normal waveform 20 is associated with block 26 and the waveform 22 is associated with block 28. It will be appreciated that the blocks 26 and 28 can correspond to different states of waveform generator circuitry, each state configured to provide a respective waveform 20, 22. Alternatively, the blocks 26 and 28 can correspond to separate sources (e.g., circuits) that cooperate to provide one of the waveforms 20, 22 based on the operating mode, such as indicated by the mode selection signal 16. According to one aspect of the present invention, the intermediate level of the signal associated with the signal block 22 is provided at a level that is functionally related to process variations associated with the integrated circuit implementing the system 10 and the associated circuitry 18. As a result, such an approach facilitates the evaluation and verification of the associated circuitry. Those skilled in the art will understand and appreciate various arrangements and configurations of circuitry that can be utilized to provide a temporarily modified output at 14.

In one particular aspect of the present invention, the corresponding signal at 14 is provided to control a precharge device 30 of the associated circuitry 18. The precharge device 30, for example, is coupled to charge a precharge node of the associated circuitry 18 based on the signal provided at 14. When the output signal at 14 is provided at the intermediate level, according to an aspect of the present invention, the precharge device 30 partially conducts so as to supply a corresponding amount of current to the precharge node to help maintain a desired voltage. This allows potential noise to settle out of the circuitry 18. This protects the associated circuitry 18 during burn-in or other high-stress conditions associated with the noise reduction mode. Thus, by controlling the precharge device 30 in this manner, noise and leakage immunity is enhanced, which improves the accuracy associated with evaluation of the circuitry 18 during the noise reduction mode (e.g., burn-in).

Figure 2:
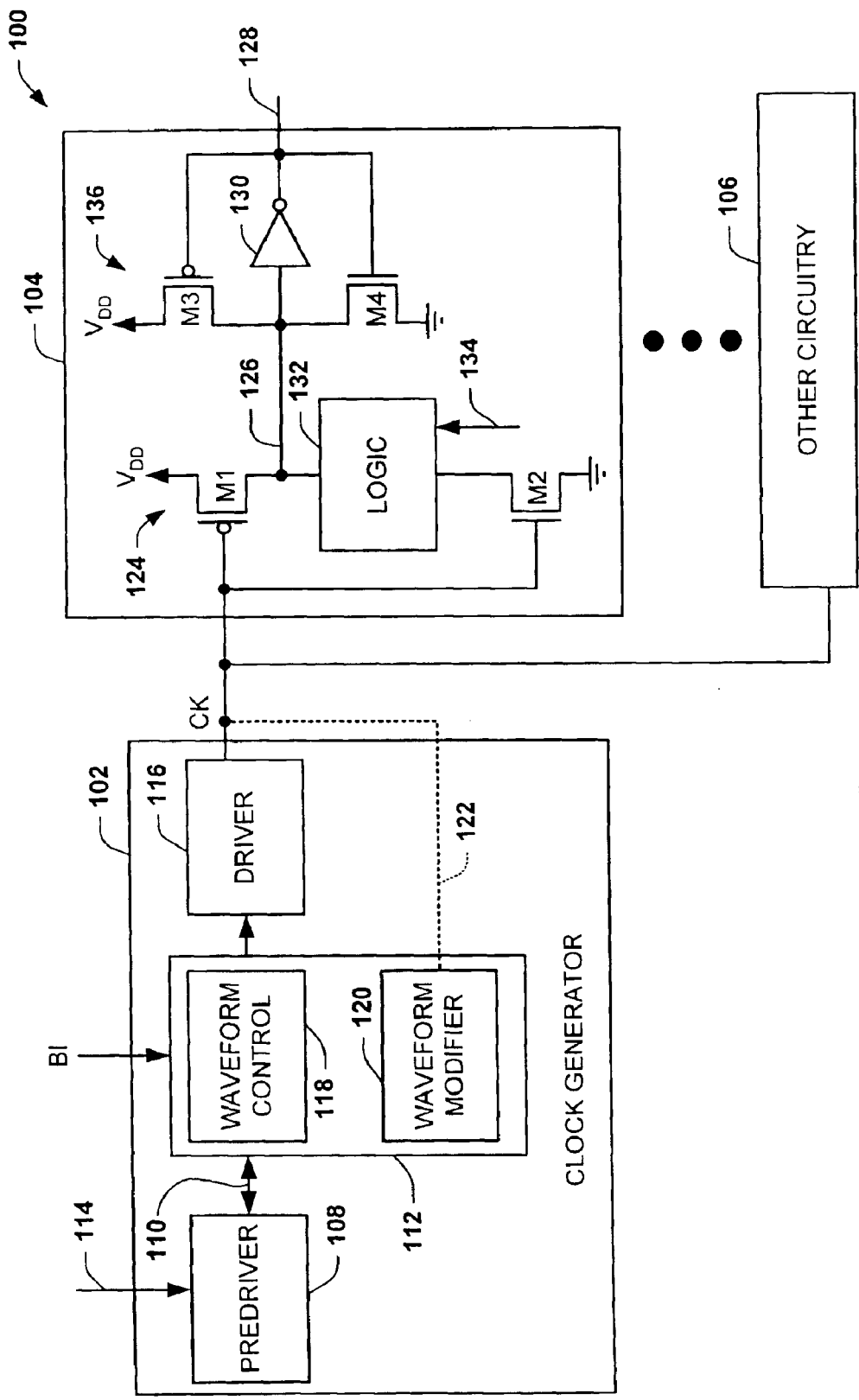
FIG. 2 depicts a clock generator for controlling plural associated circuits in accordance with an embodiment of the present invention.

FIG. 2 illustrates an example of part of an integrated circuit (IC) 100 that includes a clock generator (or gater) 102 implemented in accordance with an aspect of the present invention. The clock generator 102 is coupled to control associated circuitry, such as a plurality of circuits, indicated at 104 and 106. The clock generator 102 controls the circuits 104–106 with a clock signal, indicated at CK. The clock signal CK, for example, gates one or more associated precharge devices of the respective circuits 104–106 to facilitate evaluating state information (e.g., logic state) of such circuitry. It is will be appreciated that there can be any number of one or more associated circuitry 104–106, as indicated by the ellipsis. For example, there typically are hundreds or thousands of such circuits associated with a clock generator in a typical VLSI design (e.g., a microprocessor).

The clock generator 102 includes a predriver 108 that provides one or more signals 110 to an associated waveform control block 112 based on one or more predriver input signals 114. The one or more predriver input signals 114 can include an oscillator input signal provided (e.g., by an oscillator) that controls the frequency of the clock signal CK provided by the clock generator 102. The operating frequency further can vary based on the operating mode.

The control block 112 is coupled between the predriver 108 and an associated driver 116. The control block 112 controls the driver 116 to provide the clock signal CK according to an operating mode of the system 100 and based on the one or more signals 110. The operating mode can be determined from a mode selection signal, indicated at BI. For example, the mode selection signal BI can have two more states, such as one state indicating a normal operating mode and another state indicating a noise reduction mode. The noise reduction mode, for example, corresponds to a burn-in process that operates the associated circuits 104–106 under high stress conditions, such as at a higher voltage and a higher temperature, as well as usually a lower frequency than in the normal operating mode. The control block 112 also can provide feedback information to the predriver 108, such as indicating operation of the control block during the noise reduction mode.

In a normal operating mode, the control block 112 controls the driver 116 to provide the clock signal CK to alternate between normally high and low levels at a desired clock frequency. During a noise reduction mode, such as burn-in, the control block 112 controls the driver 116 to temporarily modify the clock signal CK, such as to include an intermediate level (e.g., a shelf) between its normally high and low levels. The clock signal can be provided at the intermediate level for a predetermined duration, corresponding to a first portion of a clock cycle. After maintaining the intermediate level for the desired duration, the clock signal transitions to one of its normally high or low clock level (e.g., for the remainder of the first portion of the clock cycle). The clock signal CK then transitions to the other (e.g., low) level for a second, final part of the clock cycle. The clock signal can repeat this waveform while in the noise reduction mode. The clock frequency during the noise reduction mode (e.g., burn-in) is usually much lower than during normal operation. That is, a cycle for the clock signal during the noise reduction mode is greater than (e.g., at least five, ten or even hundreds of times greater) than the duration of a clock cycle during the normal mode (referred to herein as a normal clock cycle).

It is to be appreciated that by temporarily operating the clock signal CK at the intermediate level during burn-in, the associated circuitry 104–106 can be controlled so as to improve noise immunity and mitigate leakage in such circuits. That is, the mode of control implemented by providing the clock signal CK at the intermediate level allows noise events to settle out the associated circuitry 104–106. The intermediate level of the clock signal CK generated by the driver 116 can be variable or fixed. Additionally or alternatively, the duration at the intermediate level can be fixed or variable, such as based on a delay implemented by the control block 112. The control block 112, for example, can provide feedback to the predriver 108 to control the duration of the intermediate signal according to the delay being implemented.

The control block 112 can be implemented as an active buffer network that is controlled by the predriver 108 to bias one or more devices in the driver 116 in a desired manner. Those skilled in the art will appreciate various approaches that can be utilized to implement the control block 112 as a modular extension of many existing clock generators.

The example of FIG. 2 depicts the control block 112 as including first and second functional portions, indicated as a waveform control block 118 and a waveform modifier 120. The waveform control block 118 and the waveform modifier 120 cooperate to control the driver 116 to provide the clock signal CK according to the operating mode of the system, as mentioned above. For example, the waveform control block 118 represents control functionality during a normal operating mode to control the driver 116 so that the clock signal CK transition between its normally high and low levels at a desired frequency. The modifier 120 represents control functionality implemented to control the driver 116 to provide the clock signal CK at a temporary intermediate level for a portion of a clock cycle during a noise reduction mode, such as burn-in. The waveform control block 118 and the modifier 120 can be implemented by the same or different circuitry of the control block 112. For example, when the waveform control block 118 and waveform modifier 120 are implemented by the same circuitry, different components or devices of such circuitry can be activated differently to provide corresponding control signals to the driver 116 according to the operating mode.

Alternatively, the waveform modifier 120 can be implemented separately from the waveform control block 118, which can be internal or external relative to the clock generator 102. For example, the modifier 120 can be activated during the noise reduction mode, such as based on the BI signal, and cause the clock signal CK to be provided at the desired intermediate level for the predetermined duration. This manner of directly controlling the clock signal CK at the intermediate level is schematically indicated by dotted lines 122. Those skilled in the art will understand and appreciate other methods that can be utilized to provide a clock signal CK that is temporarily modified to an intermediate level during a noise reduction mode, all of which are contemplated as falling within the scope of the appended claims.

According to one aspect of the present invention, the intermediate level of the clock signal CK during burn-in is self-biasing (e.g., tuned), such as according to the relative strengths of the components comprising the driver 116. The relative strength of such components, for example, depends on process variations associated with fabrication of the IC 100. Such process variations tend to be localized and thus can vary across the IC 100. Because the level of the clock signal CK is tuned to an intermediate level that reflects local process variations in the driver 116 and since at least a substantial portion of the associated circuitry 104–106 is located proximal to the driver, the clock signal CK drives the associated circuitry at a level that mitigates the effects of corresponding process variations in such circuitry.

By way of example, where the IC 100 is fabricated using a BiCMOS (Bipolar Complimentary Metal Oxide Semiconductor) process, local process variations in the relative strength of p-type and n-type devices may exist. These process variations can affect operation of p-type and n-type devices differently. During the noise reduction mode, the control block 112 provides one or more signals that control the driver 116 to temporarily provide the clock signal CK at a corresponding intermediate level. Additionally, the driver can cooperate with the control block 112, and/or the predriver 108 to form a circuit arrangement that provides the clock signal CK based on the relative strength of NMOS and PMOS devices in the circuit arrangement. The clock signal CK at the intermediate level thus can mitigate the effects of process variations in the associated circuitry 104–106 during a burn-in process since similar process variations exist in the driver and in the associated circuitry.

In the example of FIG. 2, the associated circuit 104 is implemented as a domino logic circuit. Those skilled in the art will understand and appreciate various configurations of domino circuits that can be utilized in this or the other dynamic circuitry 106. As mentioned above, typically hundreds or thousands of such circuits 104–106 are driven by a given clock generator. For purposes of simplification of illustration, the contents of the associated circuitry 104 is depicted in FIG. 2. The other circuitry 106, including the type of domino circuits implemented therein, can be the same or different from that of the circuitry 104.

Referring to the contents of the circuit 104, a precharge device 124 receives the clock signal CK from the driver 116. For example, the precharge device 124 is illustrated as a PFET (p-type Metal Oxide Semiconductor Field Effect Transistor (MOSFET)) M1 that is coupled between $V_{DD}$ and a precharge node 126. The precharge node 126 is coupled to an output 128 through an inverter 130. Additionally, the precharge node 126 is coupled to an associated logic block 132. Those skilled in the art will appreciate that any type of logic circuitry can be implemented as logic block 132 (e.g., AND/NAND functions, OR/NOR functions, exclusive OR/NOR functions or combinations thereof). Thus, one or more input signals 134 can be provided as inputs to the logic block 132. The logic function implemented by the logic block 132 thus can be evaluated for the one or more input signals 134, such as when the node 126 is charged high.

For purposes of illustration, the domino logic circuitry 104 is illustrated with an optional NFET (n-type MOSFET) M2 coupled between the logic block 132 and ground. M2 is also controlled by clock signal CK from the driver 116. It is understood that the driver 116 could be configured to provide different control signals to M1 and M2.

In order to maintain the charge at the precharge node 126, the circuitry 104 also includes an associated keeper 136. In this example, the keeper 136 includes a PFET M3 coupled between the precharge node 126 and $V_{DD}$ and having its gate coupled to the output 128. An optional NFET M4 also is coupled between the precharge node 126 and ground, with its gate also coupled to the output 128. The keeper 136 operates as latch by helping maintain a dynamically stored value or state at the precharge node 126 based on the output 128. Thus, the logic function of the logic block 132 can be evaluated based on the clock signal CK by causing the precharge node 126 to change states monotonically based on the inputs to the logic block. For example, if the output 128 is low, the precharge node 126 will be maintained in a high condition, as M3 will couple the node to $V_{DD}$. Conversely, if the output at 128 is high, M4 will couple the precharge node 126 to ground to hold a low state. During operation, there typically will be leakage from the node 126 to ground through M4, which leakage establishes a low frequency limit for the circuitry 104. The leakage becomes more pronounced at lower frequencies, such as usually implemented at burn-in. Those skilled in the art will appreciate various other types of keeper arrangements that can be utilized to help maintain a desired charge at the node 126.

According to an aspect of the present invention, the precharge device 124 operates as a supplemental keeper during burn-in. In particular, the precharge device 128 partially conducts current to the precharge node 126 during burn-in based on the clock signal CK being provided at the intermediate level for the predetermined duration. As a result, the precharge device 124 can source current to the precharge node 126 to enable noise at such node to settle out. The other circuitry 106 driven by the clock signal CK includes similar precharge device(s) that can also operate as supplemental keepers during burn-in to improve noise and leakage immunity of such circuitry. Because noise is mitigated, accurate operation and evaluation of the associated circuitry is facilitated.

By modifying the clock signal temporarily, such as to a reduced level during burn-in, keeper design requirements for the associated circuits 104–106 can be minimized in accordance with an aspect of the present invention. That is, because the clock signal is modified to enable existing components (e.g., the precharge device 124) to precharge the node 120 during burn-in, the associated circuitry 104–106 do not require extra components as might otherwise be necessary to enhance the functionality of the keeper 130 for burn-in.

As mentioned above, the precharge devices in the circuitry 104–106 are temporarily biased to an intermediate level during burn-in, which level can vary based on relative characteristics of components (e.g., PFET and NFET devices) implemented in the driver 116. For example, the intermediate level of the clock signal CK during burn-in varies based on the relative strengths of output PFET and NFET devices in the driver 116. During burn-in, these driver devices cooperate with components of the control block 112 to provide the clock signal CK. The differences in the relative strengths of these devices, which are due to process variations, will be substantially similar to process variations in the associated circuitry 104–106. In particular, because the associated circuits 104–106 are in a relatively close proximity to the clock generator 102 in the IC 100, the intermediate level of the clock signal CK is self-biasing to mitigate the effects of process variations in the respective circuits 104–106.

Additionally, by implementing such a control block (e.g., the waveform control block 118 and the waveform modifier 120) in multiple clock generators distributed across a VLSI chip, such as a microprocessor, burn-in can be facilitated across the entire chip. Further, because each such waveform modifier can be implemented in a respective clock generator that controls a plurality of associated circuitry 104–106 (e.g., typically on the order of hundreds or thousands of circuits), a minimal amount of die area is required for implementing a protection system to mitigate noise during burn-in. As a result of employing smaller keepers, this approach further enables greater device densities to be achieved as well as faster circuit operation. That is, the present invention facilitates a reduction in the size of keeper circuits, while maintaining or improving performance of such circuitry during burn-in and normal operation. This is to be contrasted with conventional approaches in which each associated circuit implements its own larger associated keeper to help maintain the charge at the precharge node thereof during burn-in.

FIGS. 3 and 4 are graphs depicting signals that can be generated by a gater network implemented in accordance with an aspect of the present invention. In FIG. 3, a burn-in enable signal is indicated at 140. As depicted in FIG. 3, the burn-in enable signal 140 remains low until time T3 in which the signal goes high. A corresponding clock signal is depicted for normal operation, indicated at 142, which goes high at T1 and goes low at T2. That is, the clock signal 142 transitions between its normal high and low levels (up to T3) according to its set clock frequency and duty cycle.

While the burn-in enable signal 140 is high (after T3), the driver temporarily provides the clock signal 142 at an intermediate level between its high and low levels for a predetermined duration, indicated from T4 to T5. In particular, while the burn-in enable signal 140 is high, the clock signal 142 rises from its low level (e.g., zero volts) to its intermediate level, corresponding to a voltage shelf 144. After T5, the clock signal 142 rises from the voltage shelf 144 to its normally high level where it remains until T6. For purposes of illustration, the duration of the modified pulse from T4 through T6 is substantially commensurate to the pulse duration during normal operation, namely from T1 to T2. It will be appreciated understood, however, that the clock frequency normally is much lower during a noise reduction mode, such as burn-in. Thus, the duration from T4 to T5 corresponding to the intermediate level can be set to duration is sufficient to allow noise events to settle out (e.g. about one to five normal clock cycles). The duration will depend on the particular circuitry being controlled by the clock signal 142.

The clock signal 142 depicted in FIG. 3 can be generated based on control input signals provided to the driver, such as the driver control signals depicted in FIG. 2. For purposes of comparison, the ordinate axis in the graph of FIG. 4 includes the same timing references T1–T6, as utilized in FIG. 3.

Figure 5:
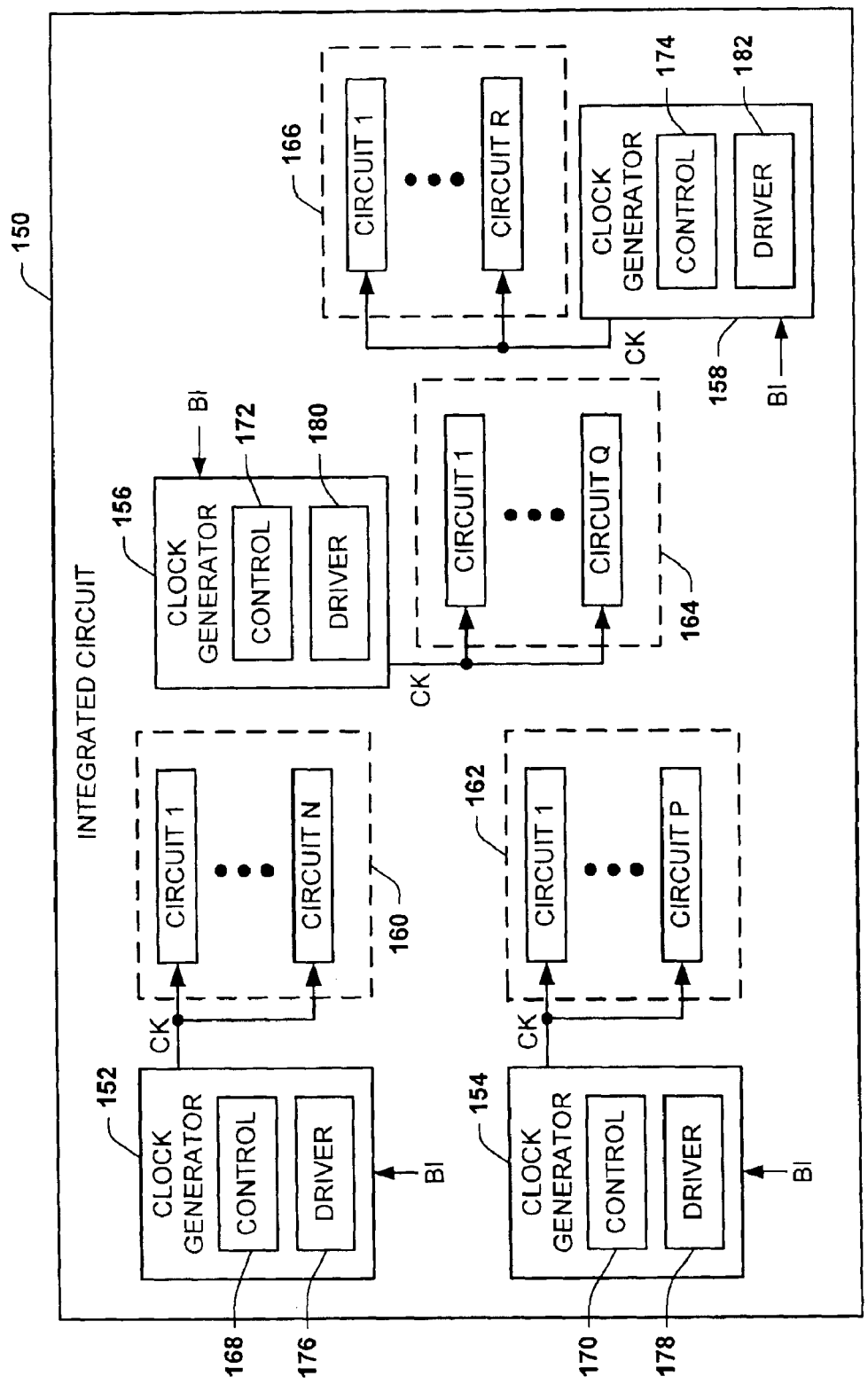
FIG. 5 depicts an example of an integrated circuit chip that includes plural clock generators distributed across the chip in accordance with an embodiment of the present invention.

FIG. 4 depicts control signals 146 and 148 that can be provided to an associated driver to generate the output clock waveform 142 depicted in FIG. 5 in accordance with an aspect of the present invention. For example, the driver can be implemented as including a PFET coupled in series with an NFET between voltage rails, with the driver output provided at a common collector of the PFET and NFET devices. A waveform control block implemented according to an aspect of the present invention provides control signals to the respective gates of the PFET and NFET devices. During normal operation, the control signals can be shorted together. Accordingly, the signals 146 and 148 are substantially identical up to about T4. At about T4, when the clock pulse 142 begins its transition from low to high and the burn-in enable signal 140 is high, the signals 146 and 148 are driven to respective intermediate levels indicated at V1 and V2, respectively. For example, the signal 148 can be generated by diode connecting an associated output PFET of the driver. The signal 146 also is driven at a reduced level, such that the clock signal 142 (FIG. 3) is driven at a corresponding intermediate level based on the relative strengths of the PFET and NFET devices being gated by signals 146 and 148.

The control signals 146 and 148 are driven at their reduced levels for a predetermined duration, which can be controlled by a delay implemented by associated clock gater circuitry. After the duration, near T5, the signals 146 and 148 are again shorted together and thus return to their low level for the remainder of their associated clock cycle. This results in the clock signal being driven high from T5 to about T6. The modified control waveforms 146 and 148 can be repeatedly implemented during the noise reduction mode according to an aspect of the present invention. In this way, one or more associated precharge devices driven during burn-in clock signal 142 (FIG. 3) can partially conduct current to an associated precharge node to improve noise immunity and mitigate leakage at the precharge node, as described herein. This results in improved operation of the dynamic circuitry to facilitate burn-in according to an aspect of the present invention.

FIG. 5 is an example of an integrated circuit (IC) chip 150 that includes a plurality of clock-generator system 152, 154, 156 and 158 distributed across the chip. Each clock generator 152–158 is coupled to drive a set of associated circuits 160, 162, 164 and 166 according to respective clock signals CK generated thereby. Those skilled in the art will appreciate that any number of one or more (e.g., typically on the order of hundreds or thousands) such circuits can be associated with each clock generator 152–158. Each circuit, for example, is a domino logic circuit, configured to enable evaluation of associated logic circuitry (not shown).

Each clock generator 152–158 includes a respective waveform control block 168, 170, 172 and 174. The control blocks 168–174 are associated with respective drivers 176, 178, 180 and 182 for controlling a clock output signal CK provided to the associated circuitry 160–166. The particular design and configuration of the drivers 176–182 can vary according to the number and type of associated circuits 160–166 being driven thereby. In a normal operating mode, the drivers 176–182 provide a normal clock signal that alternates between high and low levels at a desired frequency and duty cycle.

In a noise reduction mode, such as associated with burn-in, the control blocks 168–174 control the respective drivers 176–182 to provide a temporarily modified output signal. In one aspect of the present invention, the control blocks 168–174 control the drivers 176–182 to provide the clock signals CK at an intermediate level between the normally high and low levels for a predetermined duration. For example, at a transition from the normally low level, the clock signals can be provided at the intermediate level for a sufficient period of time to enable noise to settle out of the associated circuits 160–166. After providing the clock signals CK at the intermediate level for the desired duration, the clock signals CK can be provided at their normally high level for a second part of the clock cycle. The clock signals transition from the high to low level for the remainder of the clock cycle.

A waveform having these types of characteristics can be repeated over a plurality of clock cycles while in the noise reduction mode. The noise reduction mode can be controlled based at least in part on a BI signal. The BI signal, for example, corresponds to a burn-in enable signal, which can be provided to each of the clock generators 152–158 to select the noise reduction mode. The period of time that the clock signal is provided at the intermediate, high and low levels depends on the duty cycle and frequency of the clock signal. The frequency during the noise reduction mode, such as during burn-in, can be much lower than during the normal operating mode, with the duration of the intermediate level lasting one or more times the clock cycle implemented in the normal operating mode.

The respective control blocks 168–174, while illustrated schematically in FIG. 5, can be implemented in any manner based on the teachings contained herein to provide a clock signal having an intermediate level (e.g., a voltage shelf) between the normally high and low levels of the clock signal. Additionally, the intermediate level of each respective clock signal CK implemented during burn-in can be provided at a level that mitigates local process variations. For example, each respective driver 176–182 and/or other circuitry of the clock generators 152–158 provide the clock signal at an intermediate level functionally related to the local process variations in such circuitry. Because the associated circuits 160–166 are implemented across the IC 150 in close proximity to their respective clock generators 152–158, employing a self-biasing intermediate clock level during burn-in can mitigate similar process variations that may exist in such Circuits.

Those skilled in the art will understand and appreciate various arrangements that could be utilized to implement such a fixed or self-biasing voltage (e.g., voltage dividers in an arrangement of transistors or resistors), all of which are contemplated as falling within the scope of the appended claims.

Figure 6:
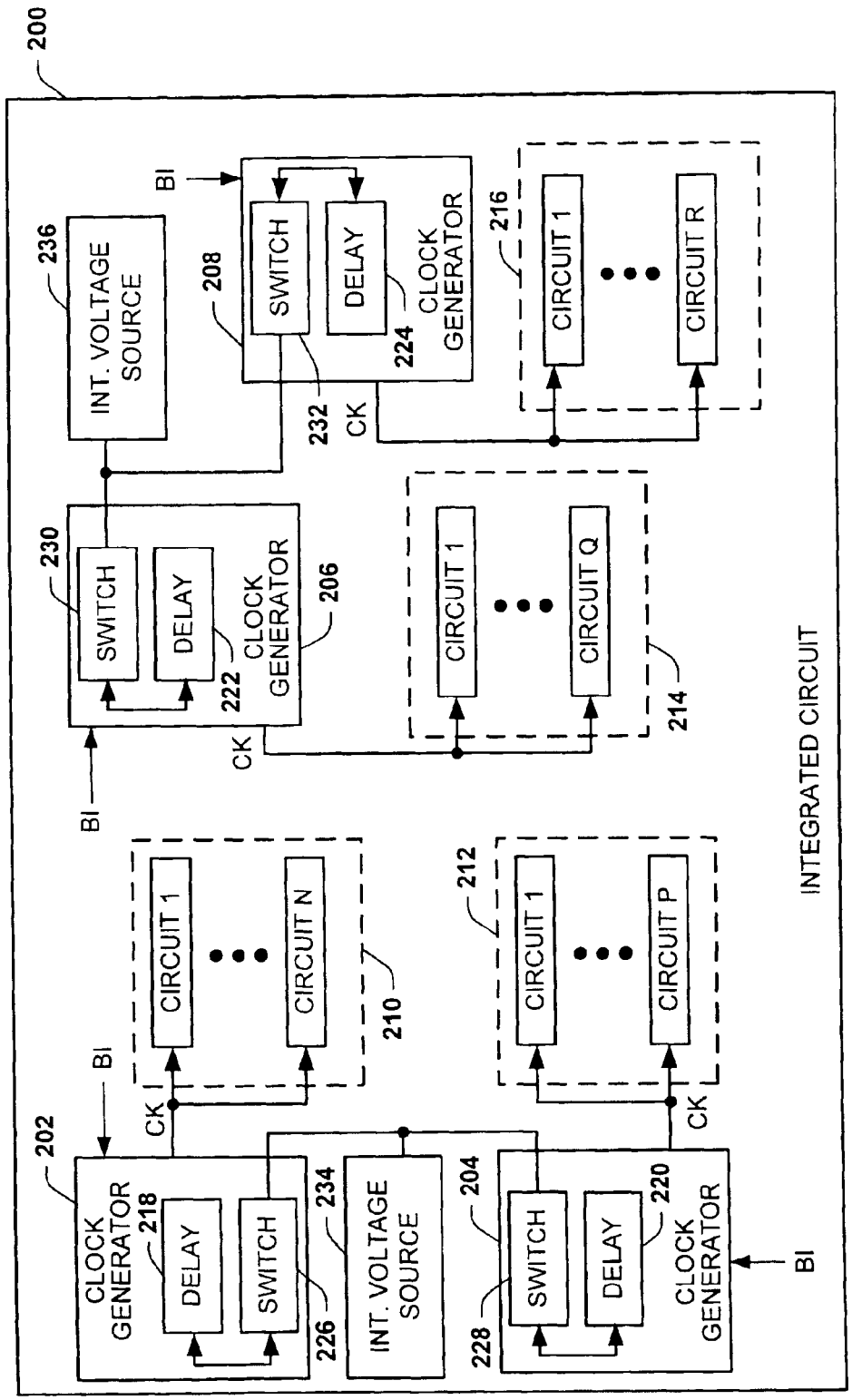
FIG. 6 depicts an example of an integrated circuit chip that includes plural clock generators distributed across the chip in accordance with another embodiment of the present invention.

By way of further example, FIG. 6 depicts another example of an IC 200 that can be implemented in accordance with an aspect of the present invention. The IC 200 in FIG. 6 is similar to that shown and described in FIG. 5, although a different approach is utilized to temporarily modify the clock signal CK according to an aspect of the present invention. The IC 200 includes a plurality of clock-generator system 202, 204, 206 and 208 distributed across the chip. Each clock generator 202–208 generates a clock signal CK to drive a set of associated circuits 210, 212, 214 and 216. The clock generators 202–208 generate the clock signals CK according to an operating mode of the IC, which mode can at least partially depend on a mode selection signal BI. The mode selection signal BI, for example, corresponds to a burn-in enable signal indicative of an associated burn-in process for the IC 200.

Each of the clock generators 202–208 is configured to provide the respective clock signals to alternate between normally high and low levels at a desired frequency during a normal operating mode. During a noise reduction mode, such as burn-in, the clock generators 202–208 provide a temporarily modified clock signals CK that maintains an intermediate level between its normally high and low levels for a predetermined duration. For example, the clock signal CK can transition from its low level to the intermediate level and remain at the intermediate level for the predetermined duration. After the duration, the clock signal CK transitions to its high level and then returns to its low level (e.g., as illustrated in FIG. 3).

Additionally, each of the clock generators 202–208 includes a delay element 218, 220, 222 and 224 and a switch element 226, 228, 230 and 232. In the example of FIG. 6, the switch elements 226 and 204 are coupled to an intermediate voltage source 234 and the switch elements 230 and 232 are coupled to another intermediate voltage source 236. It is to be appreciated that any number of one or more such intermediate voltage sources could be implemented across the IC 200. The voltage level provided by each such intermediate voltage source 234, 236 could be the same level or different levels. For example, different intermediate voltage levels between the normally high and low voltage levels can be provided to different sets of circuits 210–216 across the IC 200. In this way, the respective different levels of the intermediate voltage sources 234–236 can be adjusted to account for local process variations.

The clock generators 202–208 employ the delay elements 218–224 and switch elements 226–232 to provide the clock signals CK at the intermediate level for a desired duration during the noise reduction mode, such as indicated by the mode selection signal BI. For example, the delay elements 218–224 control the duration for which respective switch elements 226–232 couple the associated intermediate voltage sources to the node (or bus) at which the clock signals CK are provided. After the predetermined duration, each delay element 218–224 causes its associated switch element 226–232 to disconnect the associated intermediate voltage source from the clock output. Normal operation of the clock generators 202 can resume substantially contemporaneously with the switch elements 226–232 disconnecting the intermediate voltage source. That is, for each clock cycle in the normal mode, the clock signals can be provided at a high (or low) level for a corresponding part of the clock cycle, and then at a low (or high) level for the next part of the clock cycle.

Those skilled in the art will appreciate various circuits that can be utilized to implement desired intermediate voltage sources 234–236. The voltage sources 234 and 236 can be implemented as voltage dividers or other circuit arrangements capable of providing a voltage that is between the normally high and low levels. The particular level can be set according to the types and configuration of the associated circuits 210–216, which level further can account for process variations in the IC. Additionally, various types of circuitry can be utilized to implement the delay. The delay should be set for a duration sufficient to allow noise to settle in the associated circuits 210–216, which facilitates evaluation during burn-in. A few clock cycles have been found to be a sufficient amount of delay, although the particular duration will vary according to the types of circuits 210–216 and the application of the IC.

Figure 7:
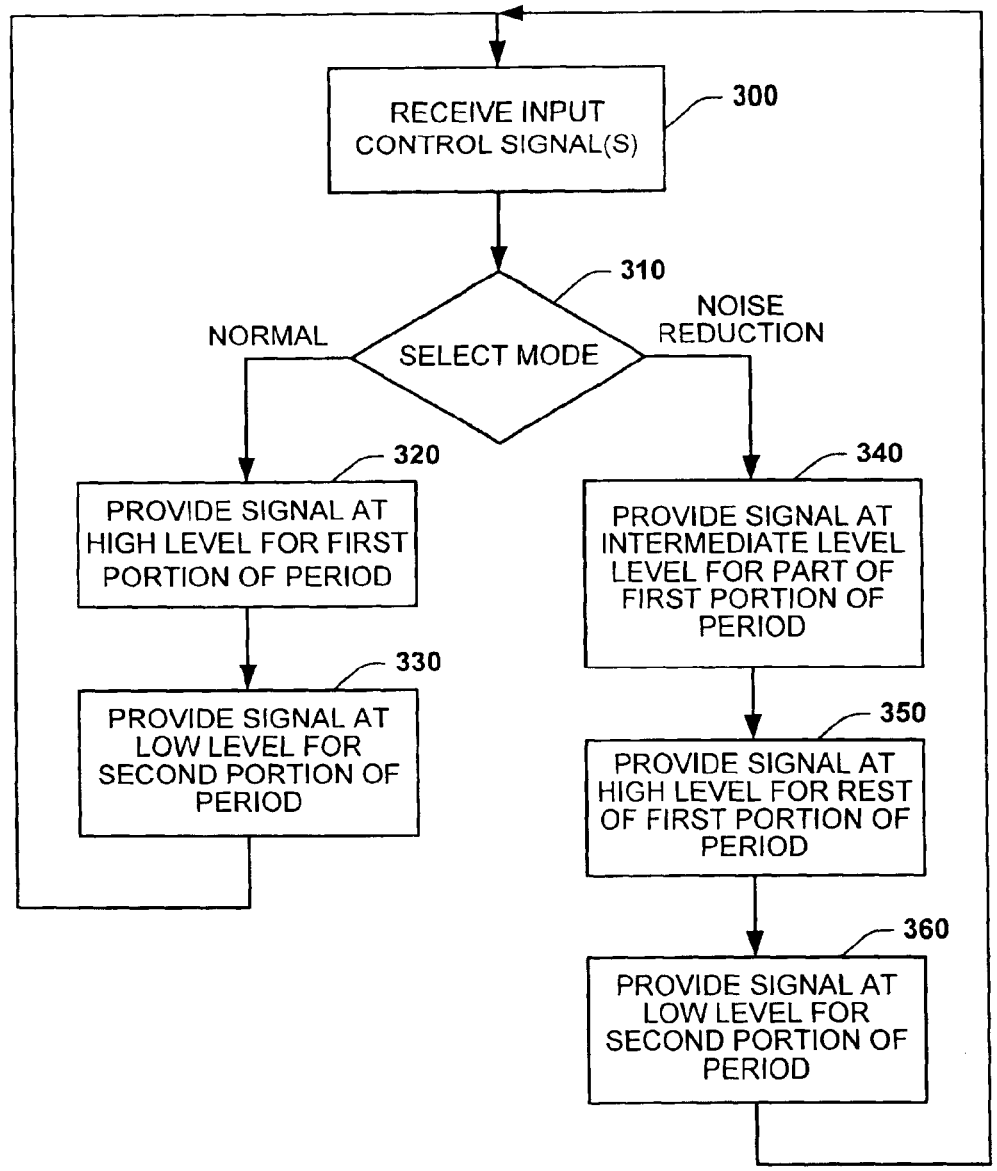
FIG. 7 is a flow diagram illustrating a basic methodology for temporarily modifying a signal in accordance with another embodiment of the present invention.
Figure 8:
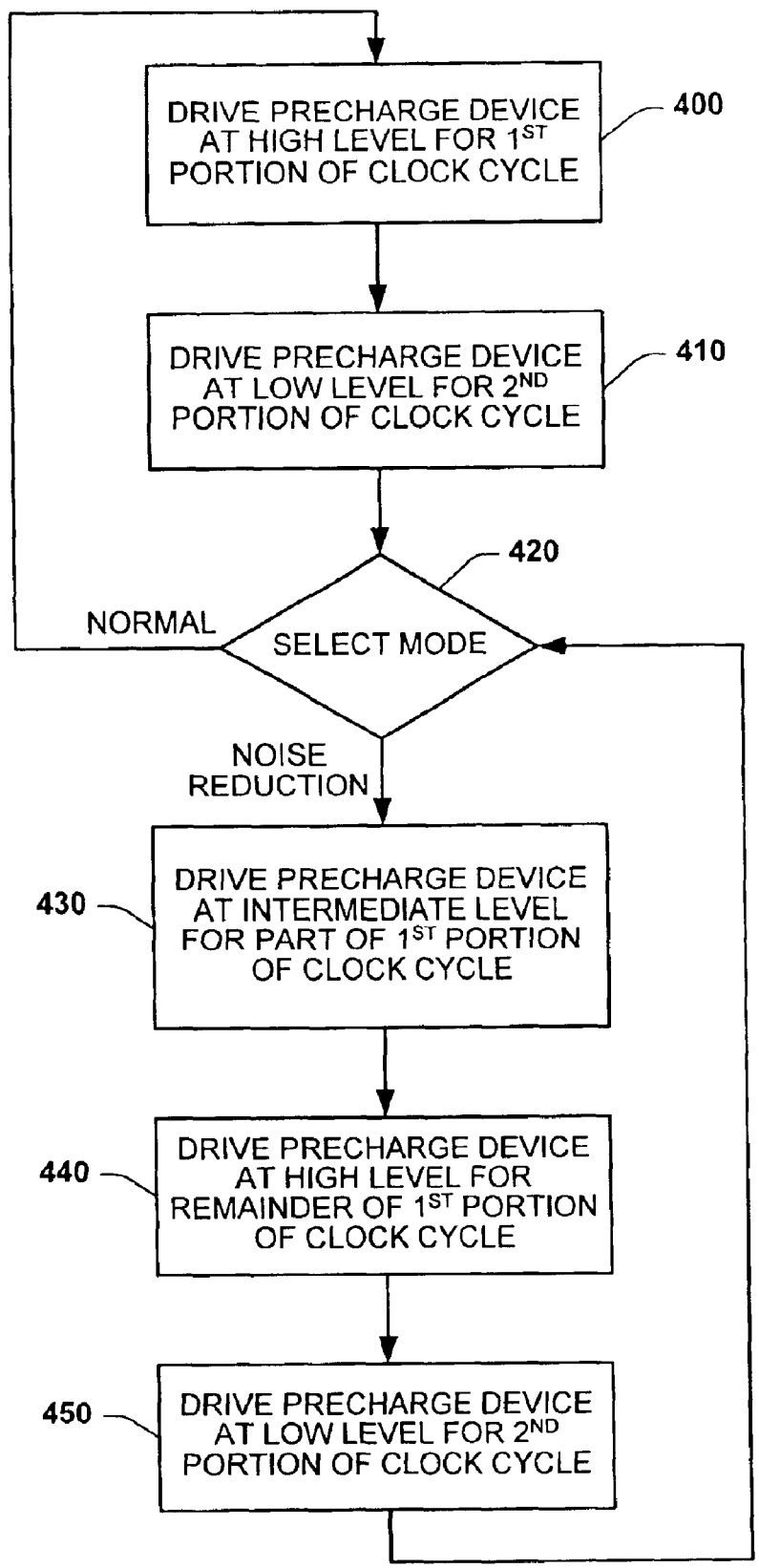
FIG. 8 is a flow diagram illustrating a methodology for controlling a device in accordance with another embodiment of the present invention.

In view of the foregoing structural and functional features described above, an amplification methodology, in accordance with an aspect of the present invention, will be better appreciated with reference to FIGS. 7 and 8. While, for purposes of simplicity of explanation, the methodologies of FIGS. 7 and 8 are shown and described as being implemented serially, it is to be understood and appreciated that the present invention is not limited to the illustrated order, as some aspects could, in accordance with the present invention, occur in different orders and/or concurrently with other aspects from that shown and described. Moreover, not all illustrated features may be required to implement a methodology in accordance with an aspect of the present invention. It is to be further understood that the following methodologies can be implemented in hardware, such as one or more integrated circuits, software, or any combination thereof.

FIG. 7 depicts a methodology for providing a signal (e.g., a clock signal) in accordance with an aspect of the present invention. The methodology for example can be implemented by a clock gater that is coupled to drive one or more associated circuits. For example, the associated circuits can include domino logic circuits that are utilized to evaluate logic functions implemented by such circuits.

The methodology begins at 300 in which one or more input control signals are received. The input control signals can include a mode selection signal that determines an operating mode of the methodology. In one aspect of the present invention, the input control signal is a burn-in enable signal that indicates a mode of operation (e.g., a high stress condition, such as burn-in) in which associated circuitry requires additional protection or reduced noise to ensure proper operation during such mode.

At 310, a decision is made as to the operating mode based on at least one of the input signals received at 300. Where the signals indicate a normal operating mode (NORMAL), the methodology proceeds to 320. At 320, an output signal is provided at a high level for a first portion of a clock cycle. Then, at 330, the output signal is provided at a low level for a second portion of the clock cycle. While the system is operating in the normal mode, the methodology can loop between 320 and 330 providing a normal clock signal that transitions between normally high and low level at a desired clock frequency.

If the determination at 310 indicates a noise reduction operating mode (NOISE REDUCTION), the methodology proceeds to 340. As mentioned above, this can correspond to a situation in which a mode selection signal (e.g., a burn-in enable signal) indicates an operating mode in which additional protection of associated circuitry is desired. At 340, the output signal is provided at an intermediate level for part of the first portion of the clock signal. The level of the output signal at the intermediate level can be set to mitigate process variations in the associated circuitry. Additionally, the duration the intermediate signal in first portion of the clock cycle can be set to any predetermined duration sufficient to allow noise to settle to an appropriate level prior to continuing with an evaluation phase associated with such circuitry. For example, most noise should settle out of associated circuitry in approximately one normal clock cycle (where a clock cycle during the noise reduction mode spans about tens or hundreds of such normal clock cycles). Thus, the output signal can be maintained at the intermediate level at 340 for two, three or more of the normal clock cycles.

At 350, the output signal is provided at the high level for the rest or remainder of the first portion of the clock cycle. It is to be understood that the output signal during the noise reduction mode (e.g., during burn-in) employs a clock cycle that is substantially greater than the clock cycle during the normal mode. Thus, the second part of the first portion of the clock cycle can include multiple normal clock cycles, which is typically greater than the intermediate signal is provided at 340.

At 360, the output signal is provided at the low level for a second portion of the clock cycle. It is to be understood that while the input signal at 300 continues to enable the noise reduction mode, the methodology can loop at 340, 350 and 360 so that the output signal is provided first at an intermediate level, then at its corresponding high level and then transitions to a low level for each respective clock cycle. It will be appreciated that alternatively, a clock cycle during the noise reduction mode could provide the signal first at the high level, which transitions to the intermediate level and then to the low level, depending on the type of device being controlled by the signal.

As mentioned above, the frequency of the output signal during such mode is much lower than during the normal mode associated with 320 and 330. Additionally, the duty cycle can be set to different values during this mode so that the output signal is maintained at the low (or high) level for a substantially greater period of time, such as to facilitate evaluation of associated circuitry.

FIG. 8 illustrates a methodology that can be utilized to control a precharge device in accordance with an aspect of the present invention. As mentioned above, a precharge device can be coupled to help maintain a charge at an associated node to which logic circuitry is coupled for purposes of evaluating the state of a logic function. For example, the pre-charge device can be a p-type (or n-type) MOSFET transistor implemented within a domino logic circuitry. The precharge device is coupled to receive a control signal, namely a clock signal, provided by a clock generator (or gater) circuit implemented in accordance with an aspect of the present invention. The methodology of FIG. 8 assumes initial operation in a normal mode in which a clock signal transitions between normally high and normally low levels at a desired clock frequency.

At 400, during the normal mode, the precharge device is driven at a high level for a first portion of a clock cycle. Where the precharge device is a PFET device, the device operates in the off condition at 400. At 410, the precharge device is driven at a low level for a second portion of the clock cycle. Continuing with the example of a PFET precharge device, this corresponds to activating the PFET to an on condition for pre-charging its associated node.

At 420, a mode decision is made to select between the normal mode associated with 400 and 410 and a noise reduction mode (e.g., burn-in). In this example, the mode is defined by the waveform associated with the clock signal, which is provided to the precharge device. That is, as the clock signal transitions between its normally high and low levels at a desired clock frequency the methodology is in the normal operating mode. In contrast, when the clock signal is temporarily modified, such as to include an intermediate level, this corresponds to the noise reduction mode. While in the normal mode, the methodology loops between 400 and 410 to drive the precharge device between normally high and low levels as described above. When operating the noise reduction mode, however, the methodology proceeds from 420 to 430.

At 430, the precharge device is driven at an intermediate level for part of the first portion of the clock cycle. The intermediate level is implemented by providing a clock waveform at the intermediate level for a period of time that is sufficiently long to allow noise (e.g., voltage bounce, supply bounce, etc.) to settle out of the circuit associated with the precharge device. For example, it may take one or two normal clock cycles for most noise events to settle out. Thus, by maintaining the intermediate level for two or three of such cycles typically will be sufficient to improve noise and leakage immunity in the associated circuits. The clock cycle in the noise reduction mode typically is much greater (e.g., at a lower frequency) than when in the normal mode. Additionally, the intermediate level of the clock signal that is utilized to drive the precharge device can be set to a level to mitigate process variations in the circuitry associated with the precharge device. For example, the signal provided by the driver includes the same types of components (e.g., PFET and NFFET devices) as associated circuitry being driven by the driver, such that include common process variations. After the noise events have settled, the methodology can proceed to 440.

At 440, the precharge device is driven at the high level for the remainder of the first portion of the clock cycle. This results in the precharge device operating in an off condition when implemented as a PFET. At 450, the precharge device is then driven at the normally low level for the second portion of the clock cycle. During the noise reduction mode, which depends on waveform characteristics of the clock signal, the methodology can loop at 430–450.

As mentioned above, the frequency of operation of the precharge device usually is much slower than in the normal mode. Accordingly, the duration at the intermediate level (e.g., normally a few normal clock cycles) is typically a very small fraction of the whole cycle time during the noise reduction mode, thereby resulting in minimal excess power consumption. Further, because the intermediate level enables the precharge device to partially conduct current to the associated precharge node, noise events in the associated circuitry can settle out, which facilitates evaluation of the associated circuitry during the noise reduction mode (e.g., burn-in). This helps to ensure proper operation of the associated circuitry during the high stress conditions often associated with the noise reduction mode. Those skilled in the art will appreciate various other circumstances or operating modes in which it may be desirable to provide the control signal at intermediate level based on the teachings contained herein. The duration and amplitude of the intermediate level can vary according to the application in which it is being employed.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for controlling an associated circuit, comprising:

providing a clock waveform to the associated circuit that transitions between normally high and low levels over a cycle in a first operating mode; and modifying the clock waveform provided to the associated circuit to include an intermediate level between the normally high and low levels over a cycle in a second operating mode.

2. The method of claim 1, further comprising implementing a delay that controls the duration for which the clock waveform is provided at the intermediate level in the second operating mode.

3. The method of claim 1, further comprising:

receiving a mode selection signal; and controlling the operating mode based on the mode selection signal.

4. The method of claim 3, the mode selection signal corresponding to an enable signal associated with a burn-in process.

5. The method of claim 1, further comprising controlling the clock waveform to be provided an intermediate level that mitigates process variations in the associated circuit.

6. The method of claim 1, a duration of the cycle in the second operating mode having a greater duration than the cycle in the first operating mode.

7. The method of claim 6, the duration of the cycle in the second operating mode being at least ten times greater in duration than the cycle in the first operating mode.

8. The method of claim 1, the second operating mode corresponding to a burn-in process.

9. The method of claim 1, the intermediate level of the clock waveform being provided to the associated circuit by a voltage source.

10. The method of claim 1, the clock waveform being provided to a plurality of associated circuits, each of the associated circuits having a respective precharge device, the method further comprising controlling the precharge devices in the plurality of associated circuits based on the clock waveform provided according to a selected one of the first and second operating modes.

11. The method of claim 1, further comprising:

causing a precharge device of the associated circuit to partially conduct based on the intermediate level of the clock waveform provided in the second operating mode, such that the precharge device operates as supplemental keeper to mitigate at least one of noise and leakage in the associated circuit during the second operating mode.

12. A clock generator comprising:

a driver that provides an output waveform to drive at least one associated circuit based on at least one control signal; and a control network that provides the at least one control signal to cause the driver to provide the output waveform to transition between normally high and low levels during a first operating mode, the control network provides the at least one control signal to cause the driver to provide the output waveform to include a temporary intermediate level that is between the normally high and low levels during a second operating mode.

13. The clock generator of claim 12, further comprising a delay element that controls a duration for which the output waveform is at the intermediate level during the second operating mode.

14. The clock generator of claim 12, further comprising an associated circuit that includes a precharge device that charges an associated node based on the output waveform provided by the driver, the precharge device partially conducts according to the intermediate level during the second operating mode, thereby operating as a supplemental keeper to mitigate noise in the associated circuit during the second operating mode.

15. The clock generator of claim 12, further comprising a voltage source that provides the output waveform at the intermediate level during the second operating mode.

16. An integrated circuit comprising the clock generator and the associated circuit of claim 12.

17. The integrated circuit of claim 16, the associated circuit further comprising a precharge device that provides a charge to an associated node of the at least one associated circuit based on the output waveform, whereby noise in the associated circuit is mitigated during the second operating mode.

18. The integrated circuit of claim 17, the associated circuit comprising a domino logic circuit that includes the precharge device, the second operating mode corresponds to a burn-in process, such that the output waveform at the intermediate level mitigates noise to facilitate evaluation of the domino logic circuit during the burn-in process.

19. The integrated circuit of claim 17, the associated circuit further comprising a plurality of associated circuits, each of the plurality of associated circuits including a respective precharge device that operates as a supplemental keeper during the second operating mode to mitigate noise in the respective associated circuit.

20. A system for providing an output waveform, comprising:

means for providing a first waveform at an output that transitions between normally high and low levels during a first operating mode;

means for providing a second waveform at the output to include an intermediate level between the normally high and low levels during a second operating mode; and means for selecting between the first and second waveforms based on a mode selection signal.

21. The system of claim 20, further comprising means for charging an associated node based on the waveform at the output, the means for charging partially conducts based on the intermediate level of the second waveform during the second operating mode, thereby operating as a supplemental keeper to mitigate noise in circuitry associated with the means for charging.

22. The system of claim 20, further comprising means for controlling the second waveform to be provided at an intermediate voltage level between the normally high and low levels to mitigate process variations in at least part of the system.

23. The system of claim 20, further comprising means for controlling a duration for which the control signal is provided at the intermediate level.

24. An integrated circuit comprising the system of claim 20.

* * * * *

UNITED STATES PATENT AND TRADEMARK OFFICE
CERTIFICATE OF CORRECTION

PATENT NO. : 6,943,586 B2 Page 1 of 1
APPLICATION NO. : 10/646935
DATED : September 13, 2005
INVENTOR(S) : Samuel D. Naffziger It is certified that error appears in the above-identified patent and that said Letters Patent is hereby corrected as shown below:

In column 14, line 35, delete "NFFET" and insert -- NFET --, therefor.

Signed and Sealed this

Eleventh Day of August, 2009

David J. Kappos
*Director of the United States Patent and Trademark Office*